United States Patent [19]

Burmer

[11] Patent Number: 5,336,636

[45] Date of Patent: Aug. 9, 1994

[54] METHOD FOR CONTACTING CONDUCTIVE STRUCTURES IN VLSI CIRCUITS

[75] Inventor: Christian Burmer, Rohrdorf, Fed. Rep. of Germany

[73] Assignee: Siemens Aktiengesellschaft, Munich, Fed. Rep. of Germany

[21] Appl. No.: 852,951

[22] Filed: Mar. 17, 1992

[30] Foreign Application Priority Data

Mar. 22, 1991 [DE] Fed. Rep. of Germany ....... 4109536

[51] Int. Cl.$^5$ ............... H01L 21/268; H01L 21/306; H01L 21/441
[52] U.S. Cl. .................... 437/173; 437/187; 437/238; 156/643; 156/663
[58] Field of Search .......... 148/DIG. 93, DIG. 135; 437/192, 187, 238, 173; 156/663, 643

[56] References Cited

U.S. PATENT DOCUMENTS

| | | | |
|---|---|---|---|
| 4,668,337 | 5/1987 | Sekwe et al ........................ | 156/643 |
| 4,693,779 | 9/1987 | Okuhira et al. ................... | 156/643 X |
| 4,868,068 | 9/1989 | Yamaguchi et al. ......... | 204/192.1 X |

OTHER PUBLICATIONS

SPIE, vol. 459 Laser Assisted Deposition, Etching, and Doping, (1984)—"UV Laser-Induced Radical-Etching For Microelectronic Processing", by G. L. Loper et al, pp. 121–127.

Solid State Technology—Jun. 1985—"Laser-Induced Chemical Vapor Deposition", by Raj Solanki et al, pp. 220–227.

*Primary Examiner*—John S. Maples
*Attorney, Agent, or Firm*—Hill, Steadman & Simpson

[57] ABSTRACT

UV-transparent insulating layers, particularly silicon oxide, overlying conductive structures on a semiconductor substrate, for example an aluminum interconnect, are locally removed in order to uncover the interconnect for measuring and testing purposes, repairs or other uses. For that purpose, the semiconductor substrate is introduced into a vacuum chamber into which a gaseous metal compound, particularly a metal carbonyl, is admitted with a carrier gas, and the light of a pulsed UV laser is directed onto the location to be exposed. No highly toxic or corrosive halogen compounds are required. After the removal of the insulating oxide layer, a metal layer can be immediately subsequently locally deposited onto the exposed interconnect from the gaseous metal carbonyl with the same method. A good contact, for example measuring tips, are thus enabled in a simple way.

9 Claims, 1 Drawing Sheet

5,336,636

METHOD FOR CONTACTING CONDUCTIVE STRUCTURES IN VLSI CIRCUITS

RELATED APPLICATION

The present application is related to copending application, Ser. No. 852,952, filed Mar. 17, 1992, of Christian Burmer, entitled "METHOD FOR THE LOCAL REMOVAL OF uv-TRANSPARENT INSULATION LAYERS ON A SEMICONDUCTOR SUBSTRATE".

BACKGROUND OF THE INVENTION

The invention is directed to a method for contacting conductive structures in VLSI circuits in a vacuum chamber with the assistance of laser light.

It is frequently necessary in semiconductor technology to undertake micro-work at a semiconductor substrate during the manufacture of integrated circuits on a semiconductor substrate. These include, among other things, the local removal of passivation or insulating layers in circuits metallized in one-layer or multi-layer fashion with the goal of making conductive structures such as, for example, interconnects or pads accessible for various purposes. Such purposes, for example, are analyses of electrical measuring and testing purposes. Furthermore, the locally exposed interconnects can be electrically conductively connected to one another by metal deposition in order, for instance, to implement design modifications in a simple way and to check their compatibility. Semiconductor modules can also be repaired in the same way. It is important in all of these purposes to produce a good electrical contact to the exposed, conductive structure.

When the insulating layer to be eroded is composed of silicon nitride or of an organic material such as, for example, polyimide, then it can be locally removed on the basis of what is referred to as ablation with the assistance of a pulsed UV laser, wherein the laser beam is directed or focused onto the desired location. Such an ablation, however, is not possible given an insulating layer having a high UV-transmission such as, for example, silicon oxide and other glass-like layers, since the layer lying therebelow would be damaged by the intense UV radiation. A number of laser-induced etching processes are known for the local removal of silicon oxide layers and are described in the article by G. Loper and M. Tabat in SPIE Vol. 459, Laser Assisted Deposition Etching and Doping (1984), pages 121–124, incorporated herein. Such laser-induced etching processes are based on the defined production of highly reactive radicals of halogen-carbon compounds with the assistance of pulsed UV lasers in a vacuum chamber, so that a chemical reaction of the silicon oxide with these radicals occurs upon formation of volatile silicon and oxygen compounds. The gaseous chlorine or fluorine compounds employed, however, have high toxicity and have an extremely corrosive effect on many materials, so that a high technological expenditure is required. Mechanical parts situated in the vacuum chamber such as, for example, xyz-tables for the exact positioning of the semiconductor substrate to be processed, become unusable due to corrosion within a short time. The exposed conductive structures often have surfaces that do not meet the demands made for a good electrical contact. In particular, an oxidation in air can generally not be prevented before, for example, metal is deposited thereon or before measuring tips are put in place.

SUMMARY OF THE INVENTION

It is therefore an object of the present invention to specify a method with which a designational, local removal of UV-transparent insulating layers on a semiconductor substrate for these purposes is enabled in a simple way and, in particular, without the employment of toxic or corrosive chemical compounds. Furthermore, the exposed structures should be immediately subsequently provided with contacts in a simple way in order, for example, to enable the placement of measuring tips.

This object is achieved in accordance with a method of the invention for contacting conductive structures in VLSI circuits on a semiconductor substrate in a vacuum chamber with use of laser light wherein at least one gaseous metal compound is provided in the vacuum chamber. At least one UV-transparent insulating layer covering the conductive structure is locally removed and a metallic layer is locally deposited on the conductive structure immediately after locally removing the insulating layer. The method is controlled with the assistance of the following parameters: laser power, pressure of the gaseous metal compound, and irradiated substrate area.

The method of the invention is based on the employment of gaseous metal compounds instead of the toxic halogen-carbon compounds; gaseous metal carbonyls are particularly suitable. Surprisingly, UV-transparent insulating layers can be removed in this way and metallic contacts can be immediately subsequently deposited on the exposed, conductive structures without interrupting the vacuum and with the same or with only a slightly modified method.

DESCRIPTION OF THE PREFERRED EMBODIMENTS

Figure 1:
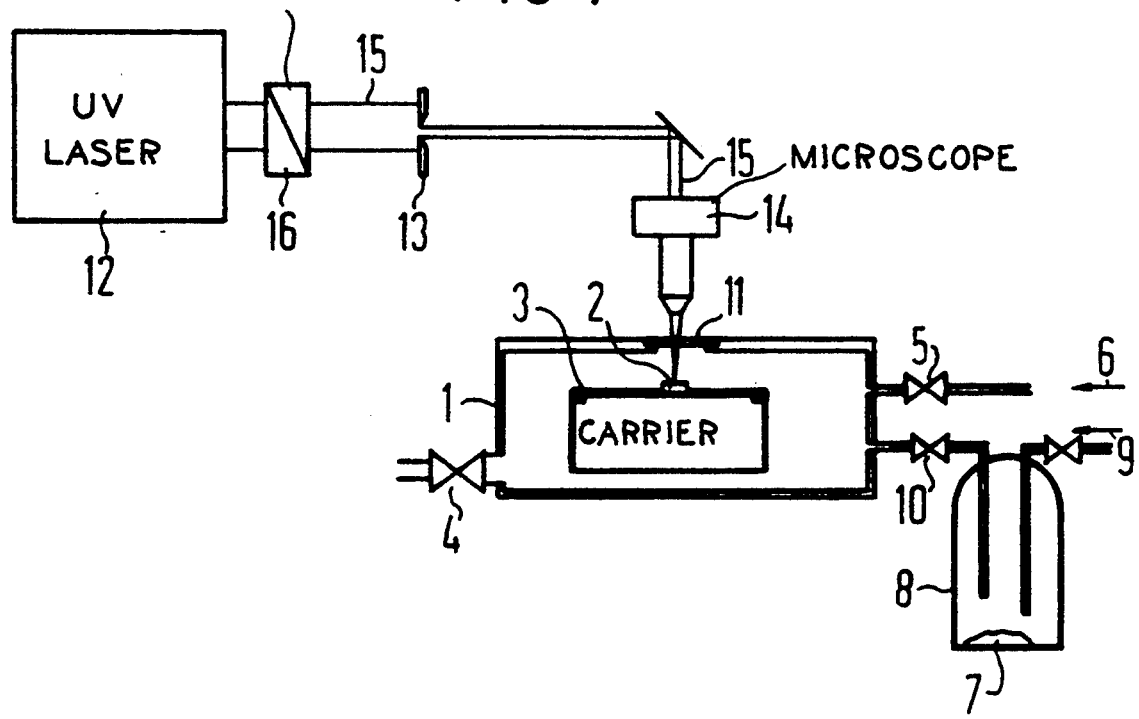
FIG. 1 shows an apparatus for the implementation of the method of the invention.

According to FIG. 1, a semiconductor substrate 2 having at least one UV-transparent insulating layer on its surface, or having an integrated circuit to be processed, is secured on a carrier 3 in a vacuum chamber 1, this carrier 3 enabling an exact positioning of the semiconductor substrate 2. Via a valve 4, the chamber 1 can be evacuated down to a pressure of approximately $10^{-6}$ mbar; an inert gas 6, for example argon, can be admitted via a further valve 5. The gaseous metal compound employed in the exemplary embodiments is tungsten hexacarbonyl $W(CO)_6$, a crystalline powder 7 at room temperature that is heated to approximately 50° C. in an evaporator vessel 8. The gas thereby arising due to sublimation is admitted into the vacuum chamber 1 via a valve 10 with the assistance of an inert carrier gas 9, usually argon. Light pulses of a UV laser 12 can be introduced into the chamber 1 through a silica glass window 11; an ArF excimer laser having a wavelength of 193 nm is preferably utilized. Every laser pulse passes through a conventional optical arrangement (not shown) generally composed of lenses and diaphragms in order to achieve a suitable, parallel light beam 15 and thereby images a rectangular diaphragm 13 onto the surface of the semiconductor substrate 2 via a suitable microscope 14. The image of the diaphragm 13 defines the size of the irradiated substrate surface 2 and can be set to satisfy the demands; typical values thereby lie in a range from 2 $\mu m \times 2$ $\mu m$ through 15 $\mu m \times 15$ $\mu m$. The energy of the laser pulses is regulated with the assistance of an attenuator 16. The irradiated specimen surface can be either locally eroded or covered with a tungsten layer dependent on the $W(CO)_6$ pressure set in the chamber, on the energy of the laser pulses and on the substrate surface itself.

Example: silicon oxide erosion with subsequent tungsten deposition.

Figure 2:
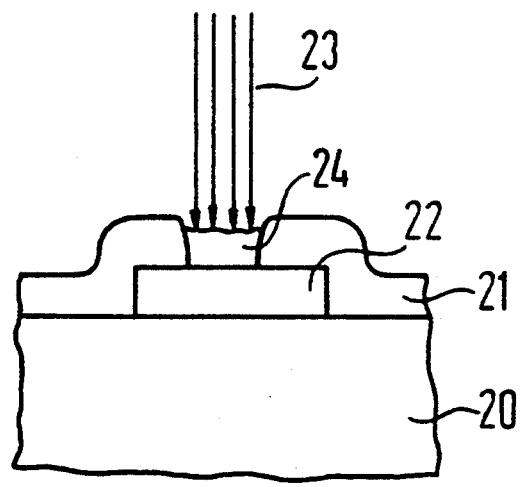
FIG. 2 shows a schematic view of a semiconductor substrate treated in accordance with the method of the invention.

According to FIG. 2, an aluminum interconnect is situated as conductive structure 22 on the semiconductor substrate 20, and a silicon dioxide layer approximately 1 $\mu m$ thick is situated thereover as UV-transparent insulating layer 21. The $SiO_2$ layer is eroded in approximately 2 minutes with the assistance of the laser beam 23 given the following setting of the process parameters. Subsequently, a tungsten layer 24 deposits on the exposed Al.

$W(CO)_6$ pressure: 0.4 mbar.
Laser pulse energy: 1.2 $\mu J$.
Pulse frequency: 50 Hz.
Laser wavelength: 193 nm.
Irradiated area: 12 $\mu m \times 12$ $\mu m$.

The aluminum structure is not attacked by this process since the pulse energy of the laser is too weak. It can be advantageous for the growth of a tungsten layer to lower the laser pulse energy to approximately 0.7 $\mu J$ and to elevate the $W(CO)_6$ pressure to approximately 1 through 2 mbar. The deposition rate then amounts to approximately 200 through 250 nm per minute.

Due to scattered radiation of the laser, a slow tungsten deposition generally occurs in the environment of the uncovered Al structure, i.e. on the oxide surface. This can be advantageous since disturbing charging phenomena in some analysis methods are thereby reduced.

The erosion of the silicon oxide layer of the method of the invention is based on the following mechanism. First, a metal-containing surface layer is deposited on the surface composed of silicon by photolytic decomposition of the metal compound in the vapor phase, i.e. a tungsten-containing layer in the exemplary embodiment. This leads to an increased absorption of the laser radiation and, thus, to a heating of the surface. When adequate energy can be absorbed after a number of laser pulses, typically 2 through 5, material, namely tungsten and silicon oxide, is eroded by the next laser pulse. A surface composed of silicon oxide is again present and the procedure begins anew until the entire silicon oxide has been eroded. A photolytic deposition of tungsten from tungsten carbonyl then occurs on the conductive structure that has been exposed, as known from the literature (see, for example, R. Solanki, Solid State Technology, June 1985, pages 220–227, incorporated herein).

Perceptibly, only the UV-transparency of the insulating layer is of significance for the method of the invention, but not the chemical composition thereof, as in the known photolytic erosion processes. The method, for example, can therefore also be employed for combinations of UV-transparent insulating layers. Furthermore, other gaseous metal compounds can be utilized from which a photolytic deposition of metal is possible. Such metal compounds are known, for example, from the afore-mentioned article by R. Solanki.

Although various minor changes and modifications might be proposed by those skilled in the art, it will be understood that I wish to include within the claims of the patent warranted hereon all such changes and modifications as reasonably come within my contribution to the art.

I claim as my invention:

1. A method for contacting a conductive structure covered by at least one UV-transparent insulating layer on a semiconductor substrate, comprising the steps of:
   providing the substrate in a vacuum chamber;
   providing at least one gaseous metal compound in the vacuum chamber;
   irradiating a surface of the insulating layer in a defined region with a laser beam having a wavelength lying in the UV range;
   forming a metal containing layer on the irradiated surface of the insulating layer, said metal-containing layer being radiation-absorbent in said UV range of said laser beam;
   due to absorption of the radiation energy in the metal-containing layer, said metal-containing layer and at least a portion of the underlying insulating layer being eroded as the underlying insulating layer is exposed, thereafter a metal-containing layer again being formed on the irradiated surface of the insulating layer and the metal-containing layer and a further portion of the underlying insulating layer again being eroded, and repeating the foregoing steps until the conductive structure is uncovered; and
   irradiating the uncovered conductive structure with a laser beam so that a metallic layer is deposited from the gaseous metal compound as a contact on the uncovered conductive structure.

2. A method according to claim 1 wherein parameters of laser power, pressure of the gaseous metal compound, and an area of said irradiated surface remain unmodified during said eroding of the insulating layer and depositing of the contact.

3. A method according to claim 1 wherein parameters of laser power, pressure of the gaseous metal compound, and an area of said irradiated surface are modified during said depositing of the contact as compared to their values during said erosion of the insulating layer.

4. A method according to claim 1 wherein the laser beam comprises a pulsed ArF laser having a wavelength of approximately 193 nm.

5. A method according to claim 1 wherein said surface of the insulation layer is irradiated with the laser beam over an area of 2 $\mu m \times 2$ $\mu m$ through 15 $\mu m \times 15$ $\mu m$.

6. A method according to claim 1 wherein values of parameters are selected within the following ranges:
   pressure of the gaseous metal compound: 0.1 through 5 mbar, energy of the laser beam: 0.5 through 20 $\mu J$, and frequency of the laser beam: 20 through 100 Hz.

7. A method for contacting a conductive structure covered by at least one UV-transparent insulating layer on a semiconductor substrate, comprising the steps of:
   providing the substrate in a vacuum chamber;
   providing at least one gaseous metal compound comprising tungsten hexacarbonyl along with a carrier gas;

irradiating a surface of the insulating layer in a defined region with a laser beam having a wavelength lying in the UV range;

forming a metal-containing layer on the irradiated surface of the insulating layer, said metal-containing layer being radiation-absorbent in said UV range of said laser beam;

due to absorption of the radiation energy in the metal-containing layer, said metal-containing layer and at least a portion of the underlying insulating layer being eroded as the underlying insulating layer is exposed, thereafter a metal-containing layer again being formed on the irradiated surface of the insulating layer and the metal-containing layer and a further portion of the underlying insulating layer again being eroded, and repeating the foregoing steps until the conductive structure is uncovered; and irradiating the uncovered conductive structure with a laser beam so that a metallic layer is deposited from the gaseous metal compound as a contact on the uncovered conductive structure.

8. A method for contacting a conductive structure on a semiconductor substrate, said conductive structure being covered by a UV-transparent insulating layer, comprising:

providing the substrate in a vacuum chamber;

introducing at least one gaseous metal compound into the vacuum chamber;

irradiating a surface of the insulating layer in a defined region with a laser beam having a wavelength lying in the UV range;

forming a metal containing layer on the irradiated surface of the insulating layer, said metal-containing layer being radiation-absorbent in said UV range of said laser beam;

by absorption of the radiation energy in the metal-containing layer, eroding said metal-containing layer and at least a portion of the underlying insulating layer until the underlying insulating layer is again exposed, and then repeating the foregoing steps until the conductive structure is uncovered; and irradiating the uncovered structure with a laser beam so that a metallic layer is deposited from the gaseous metal compound as a contact on the uncovered conductive structure.

9. A method according to claim 8 wherein the gaseous metal compound comprises a gaseous metal carbonyl.

* * * * *